United States Patent [19]

Bunker

[11] 3,832,480

[45] Aug. 27, 1974

[54] INTERMEDIATE PACKAGE AND METHOD FOR MAKING

[75] Inventor: Thomas D. Bunker, Bradford, Pa.

[73] Assignee: GTE Sylvania Incorporated, Seneca Falls, N.Y.

[22] Filed: July 7, 1972

[21] Appl. No.: 269,570

[52] U.S. Cl. ............ 174/52 S, 29/576 S, 29/630 A, 174/DIG. 3

[51] Int. Cl. ............................................. H05k 5/00

[58] Field of Search ...................... 174/DIG. 3, 52 S; 29/576 S, 630 A; 113/119

[56] References Cited

UNITED STATES PATENTS 3,628,483 12/1971 Pauza ............................ 174/DIG. 3

*Primary Examiner*—David Smith, Jr.
*Attorney, Agent, or Firm*—Norman J. O'Malley; Donald R. Castle; Lawrence R. Fraley

[57] ABSTRACT

There is disclosed an improved intermediate package to be utilized in integrated circuits wherein the end portions of individual components leads and the lateral edges of the packages' central pad are substantially vertically aligned. Additionally, a method for making the above package is also disclosed.

3 Claims, 6 Drawing Figures

PATENTED AUG 27 1974 3,832,480

INTERMEDIATE PACKAGE AND METHOD FOR MAKING

BACKGROUND OF THE INVENTION

This invention relates to integrated circuits and more particularly to fabricating intermediate packages for use in such circuits. More particularly, this invention relates to manufacturing such packages wherein the leads are prebent at approximately 80° with the plane of the package body.

Intermediate packages of this variety are well known in the art. Most usually these packages comprise a frame member, a ceramic portion constituting essentially the package body, and a central pad which is positioned in a substantially central location within the ceramic portion. Affixed to the support sides of the frame member are a plurality of individual component leads which are bent during package farication at an angle of approximately 80° with the plane of the package body. These leads have portions which extend into the body and are spaced an established distance from the central pad. Eventually, a relatively small integrated circuit, often referred to as a "chip" will be positioned on the pad and each of the individual leads of this circuit will be electrically connected to the corresponding component leads previously described. This new circuit will then be hermetically sealed in the package body to prevent the incursion of environmental gases, materials, etc. which could prove harmful to its operation. The intermediate package described herein, however, is that package which is assembled prior to insertion of the chip. The addition of this small circuit as well as the additional steps of sealing it in the package and removing portions of the frame members are usually provided by the manufacturers of integrated circuits, rather than by the manufacturers of these intermediate packages.

It is essential that packages of this variety maintain stringent dimensional requirements as well as assure the features of compactness and durability. Of particular importance is the dimension for the overall width of the package body. As can be appreciated, reduction of this width would add significantly to the compactness feature of the package. Previous efforts to reduce this dimension have often resulted in a weakening of the package body's ceramic material which in turn resulted in a cracking or other form of decomposing of this material during package handling. Many of the components encased within the material were then exposed to the previously described environmental conditions and henceforth subject to corrosion or other similar types of chemical breakdown. In many cases, the end result was a partially inoperative integrated circuit.

It is believed, therefore, that an improved intermediate package for use in integrated circuits in which the width of the package body is substantially reduced would be an advancement in the art.

OBJECTS AND SUMMARY OF THE INVENTION

It is an object of this invention to provide an improved intermediate package for use in integrated circuits.

It is another object of this invention to provide a method for fabricating such a package.

It is still another object of this invention to provide a method for fabricating such packages whereby the overall widths of the bodies of these packages are substantially reduced.

In accordance with one aspect of this invention there is provided an improved intermediate package for use in integrated circuit assemblies. This package comprises a frame member having a pair of substantially parallel support sides and a pair of substantially parallel tying sides interconnecting the support sides. A plurality of individual component leads are each affixed at one end to one of the support sides of the frame member and are formed to angle inwardly toward a central pad member where they are spaced an established distance from the pad. One lead, termed an interconnecting lead, is joined to the pad which has at least two lateral edges substantially parallel to the support sides of the frame member. A ceramic portion, serving as a hermetic seal, encapsulates the portions of the leads nearest the central pad, as well as providing a base for the pad. Each of the end portions of the component leads which are immediately adjacent the lateral edges of the pad are aligned substantially vertically with these edges prior to encapsulation of the ceramic portion. This alignment permits a substandard reduction in the overall width of the package body.

In accordance with another aspect of the present invention, a method is provided for fabricating the above-described package. This method comprises an initial step of offsetting the central pad from the plane of the leads immediately adjacent the pad and then bending the support sides of the frame and portions of the component leads which are non-adjacent the pad to thereby form a predetermined angle with said plane. A subsequent third step involves bending the tying sides of the frame in such a manner so that the end portions of the leads adjacent the central pad and the lateral edges of the pad align substantially vertically. All three of the previously described steps occur prior to the encapsulation by the ceramic portion.

DESCRIPTION OF THE PREFERRED EMBODIMENTS

For a better understanding of the present invention, together with other and further objects, advantages, and capabilities thereof, reference is made to the following disclosure and appended claims in connection with the above-described drawings.

Figure 1:
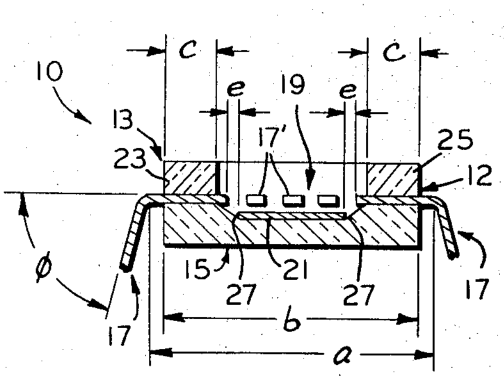
FIG. 1 is an elevational view, in section, of an intermediate package of the prior art.

With particular reference to FIG. 1, there is shown a side elevational view of a typical prior art intermediate package 10 utilized in integrated circuit assemblies having angled leads. Package 10 comprises a package body 12 which consists essentially of upper and lower ceramic portions, 13 and 15 respectively, which are formed about leads 17 as they enter body 12. The downwardly angled portions of leads 17 form an angle $\phi$ with the portions of the leads which enter package body 12 as is typical of packages of this variety. Within a central cavity 19 of package 10 is positioned a central pad 21, which rests upon a recessed area in lower ceramic portion 15. Eventually, an integrated circuit, often referred to in the industry as a chip will be positioned on pad 21 and the individual circuits of the chip will be electrically connected to corresponding ends 17' of leads 17, which exit into cavity 19. These latter steps, however, are usually completed by the manufacturers of integrated circuits and not by those who manufacture the intermediate package described herein. A typical dimension, denoted as *a*, for the distance from where the leads bend on one end of the package in order to enter body 12 to a corresponding position on the opposing end of the body is approximately .310 inch. Accordingly, a dimension, denoted as *b*, for the overall width of body 12 is approximately .250 inch. The relatively small difference in dimensions *a* and *b*, equally distributed on both ends of body 12, provides a suitable clearance whereby leads 17 may be bent away from the body.

Figure 2:
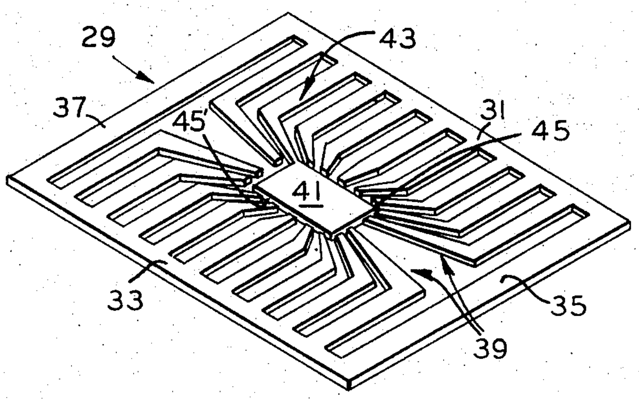
FIG. 2 is an isometric view of a frame member utilized in accordance with the subject invention.

As can be appreciated, the relatively small size of packages of this variety dictates the necessity for stringent dimensional requirements for the components which comprise these packages. Of particular importance is the width permissible for sides 23 and 25 of upper ceramic portion 13, denoted as dimensions *c* in FIG. 1. As previously explained, prior reductions in the overall width (dimension *b*) of body 12, subsequently requiring a reduction in the dimensions for sides 23 and 25 also, significantly reduced the strength of the package body material. This, in turn, caused the material to crack or otherwise decompose, therby exposing portions of leads 17, pad 21, and the integrated circuit to external gases, materials, etc. after the package was formed as a completed circuit assembly. Applicant has proposed therefore, that a successful reduction of the overall width of body 12 (dimension *b*), while still maintaining a suitable width for sides 23 and 25, can be accomplished by reducing the distance between the lead bends (dimension *a*) on both edges of the package body. In doing so, Applicant substantially elminates the horizontal spacings (dimensions *e*) between the ends 17' of leads 17 and the lateral edges 27 of pad 21. To explain the method by which Applicant achieves the above-described results, reference is first made to FIG. 2 wherein there is illustrated a typical lead frame 29 for use in the proposed invention. Lead frame 29 comprises a pair of substantially parallel support sides 31 and 33 interconnected at each end by a pair of substantially parallel tying sides 35 and 37. Attached to support sides 31 and 33 are a plurality of individual component leads 39, each of which project inwardly toward a central pad 41, about which they are spaced. At least one lead, interconnecting lead 43, is attached to central pad 41 and serves as an electrical grounding means for the completed circuit assembly. Pad 41 has at least two lateral edges 45 and 45' which are substantially parallel to support sides 31 and 33, respectively.

Figure 3:
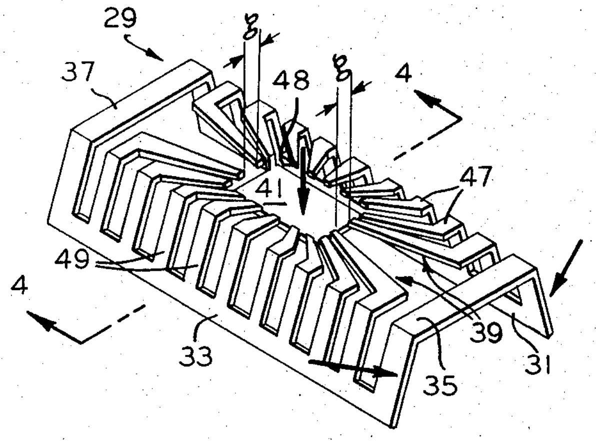
FIG. 3 is an isometric view of the frame member of FIG. 2 after completion of two of the forming steps in accordance with the method of the subject invention.

In FIG. 3, lead frame 29 is shown after completion of the first two steps in Applicant's proposed invention. In the first step, central pad 41 is moved downwardly a predetermined distance from its original position in FIG. 2, where it was shown to lie in substantially the same plane as that of component leads 39. This movement of pad 41 can be accomplished by any one of several known methods, the one preferred by Applicant being a simple stamping procedure wherein frame member 29 is placed in a conventional stamping mechanism and a corresponding stamp arm is actuated. The second step in this method, illustrated in FIGS. 3 and 4, involves bending portions of leads 39, support sides 31 and 33, tying sides 35 and 37, and a portion of interconnecting lead 43 in such a manner that these components lie in a plane forming an angle $\theta$ with the plane of the unbent portions of the leads. Angle $\theta$ is approximately 80° in most packages of this variety, but may be either increased or decreased depending on manufacturing requirements. For reasons of clarity, component leads 39 will hereafter be described as having first and second portions 47 and 49, respectively. First portions 47, as illustrated, are those projecting inwardly in a coplanar relationship toward central pad 41 and having end portions 48 thereon. Second portions 49 are those portions of the leads which are now bent away and are in turn joined on either side of frame member 29 to support sides 31 and 33.

As can be appreciated, both of the previously described steps can be accomplished concurrently, depending on the functioning ability of the various mechanisms utilized. In that any of several stamping or similar type devices known in the art are capable of satisfactorily performing these functions concurrently, it is not felt necessary to further describe or illustrate such devices. As mentioned, Applicant prefers utilizing a stamping mechanism but this is not to be construed as a limiting factor regarding the proposed invention.

Figure 4:
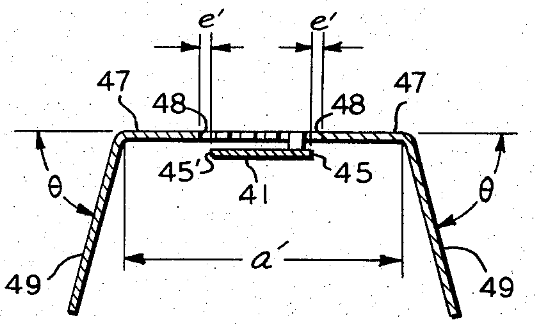
FIG. 4 is a side elevational view, in section, of the frame member as taken along the lines 4—4 in FIG. 3.
Figures 5, 6:
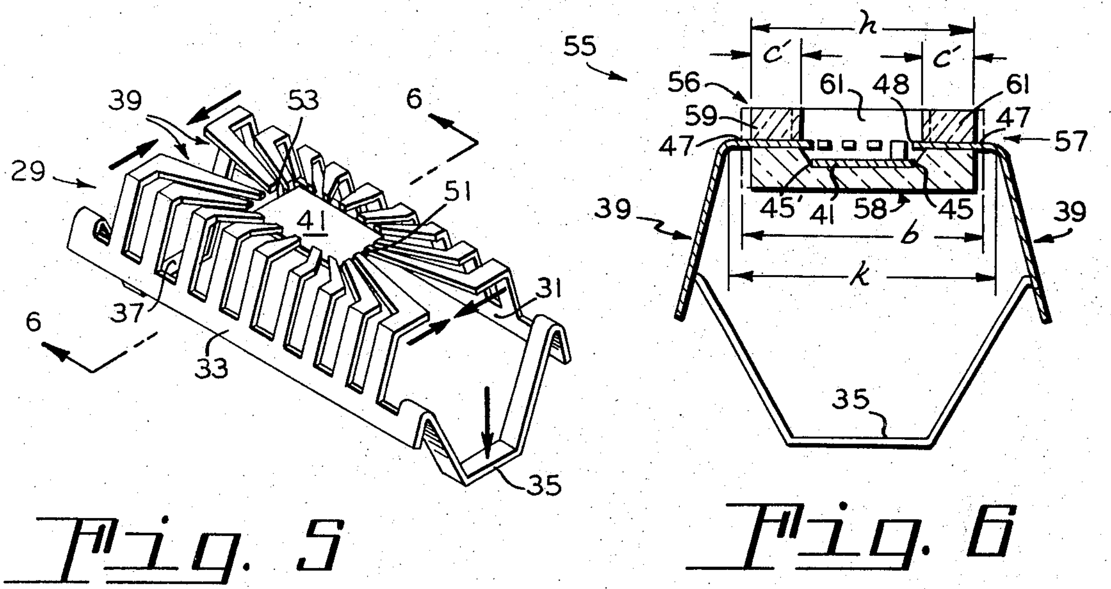
FIG. 5 is an isometric view of the frame member of FIG. 2 after completion of the third forming step in accordance with the method of the subject invention.
FIG. 6 is a side elevational view, in section, of the intermediate package produced in accordance with the method of the subject invention.

In FIG. 4, as taken along lines 4—4 in FIG. 3, it can be readily seen that after completion of the two previously described steps, there still remains a substantial horizontal spacing (dimension *e'*) between the lateral edges 45 and 45' of the now depressed central pad 41 and the end portions 48 of first portions 47 of those component leads 39 positioned immediately adjacent edges 45 and 45'. Accordingly, the distance from the lead bends (dimension *a'*) is still substantially the same as that for processed packages of the prior art, as illustrated in FIG. 1. To substantially reduce the above dimensions and therefore provide a means whereby the width of the completed package may also be reduced, a step is now performed in which a substantially downward compressive force is applied to tying sides 35 and 37 to bend them downwardly in relation to their previous positions illustrated in FIG. 3. This bending of tying sides 35 and 37, as shown in FIGS. 5 and 6, may be accomplished either manually or by a forming mechanism specifically designed for this purpose. In doing so, support sides 31 and 33 are moved inwardly in a direction substantially toward each other, this movement illustrated by the directional arrows in FIG. 5. Component leads 39, having second portions 49 affixed to support sides 31 and 33, are also moved in a similar direction thereby substantially eliminating the horizontal spacings (dimensions *e'* in FIG. 4) between end portions 48 and lateral edges 45 and 45' of pad 41. Ends 48 of first portions 47 now align substantially vertically with edges 45 and 45', as shown in FIG. 6. With further downward displacement of tying sides 35 and 37, end portions 48 can further be moved to a position whereby they overlap edges 45 and 45', although for practical purposes the displacement illustrated in FIGS. 5 and 6 is sufficient.

With reference to the displaced positions of leads 39 illustrated in FIG. 5 as opposed to their respective positions in FIG. 3, it can be readily seen that the spacings, denoted as dimensions *g* in FIG. 3, between the innermost leads on each side of frame member 29 adjacent opposing sides 51 and 53 of pad 41 are also significantly reduced. These spacings are integrally designed into frame member 29 to thereby provide a means whereby these leads do not engage during the forementioned bending steps. It is also apparent in comparing the displacements of leads 39 in FIGS. 3 and 5 that pad 41 must be retained during the bending of tying sides 35 and 37. This retention is necessary because pad 41 would move concurrently with those leads affixed to support side 31, the side to which pad 41 is also affixed. Accordingly, the spacings between first portions 47 adjacent lateral edge 45 would not thereby be reduced as described if pad 41 were not retained.

In referring to FIG. 6, there is illustrated a sectional view of the intermediate package 55 produced in accordance with the method of the proposed invention. Package body 57, which consists essentially of upper and lower ceramic portions 56 and 58 respectively, has been formed about first portions 47 of component leads 39. Additionally, body 57 is formed about the portion of interconnecting lead 43 (shown in FIG. 2) nearest central pad 41. Forming of body 57 can be accomplished through utilization of any of the well known molding operations associated with packages of this variety. The usual procedure is to align upper and lower ceramic portions 56 and 58 with first portions 47 of leads 39 and central pad 41 and then to introduce heat to cause ceramic portions 56 and 58 to form about these components. As can be seen in FIG. 6, the overall width (dimension *h*) for package body 57 has been substantially reduced in comparison to the previous width (dimension *b*) of the package body of the prior art, shown in phantom. Additionally, the spacing between the lead bends (dimension *k*) has also been substantially reduced in comparison to the corresponding dimension *a* illustrated in FIG. 1. With end portions 48 of leads 39 now substantially aligned with lateral edges 45 and 45' of pad 41, it is possible to maintain substantially similar thicknesses (dimensions *c'*) for sides 59 and 61 of package body 57 and still retain substantially the same amount of lead exposure in cavity 61 as that of prior art packages. Accordingly, the overall width of cavity 61 is now reduced from that of prior art packages.

Package 55, as illustrated, is now ready for shipment to a manufacturer of integrated circuit assemblies. If desired, tying sides 35 and 37 can be removed prior to shipment to provide a more compact package. It is preferred, however, to retain these sides during shipping and thereby provide a means whereby package rigidity is continuously maintained.

Thus, there has been shown and described an improved package for use in integrated circuit assemblies and a method for fabricating this package, the improvement comprising a substantially reduced package body width. This reduction is made possible as a result of the disclosed method which comprises initially offsetting the central pad of the package, bending the support sides of the frame member and non-adjacent portions of the leads to thereby form a predetermined angle with the plane of the leads immediately adjacent the central pad, and then bending the tying sides of the frame member in such a manner that the end portions of the leads immediately adjacent the lateral edges of the central pad and these lateral edges are substantially vertically aligned.

While there has been shown and described what are at present considered the preferred embodiments of the invention, it will be obvious to those skilled in the art that various changes and modifications may be made therein without departing from the scope of the invention as defined by the appended claims.

What is claimed is:

1. An improved intermediate package to be utilized in an integrated circuit assembly, said package comprising:

- a frame member having a pair of substantially parallel support sides and a pair of substantially parallel tying sides, said tying sides interconnecting said support sides;
- a central pad having at least two substantially parallel lateral edges substantially parallel to said support sides of said frame member;
- a plurality of individual component leads each having first and second portions, each of said first portions of said leads immediately adjacent said lateral edges of said pad having end portions thereon which are substantially vertically aligned with said lateral edges of said pad, each of said second portions of said leads affixed to one of said support sides of said frame member;
- at least one interconnecting lead joined at a first end to said central pad and at a second end to one of said support sides of said frame member; and
- a ceramic portion serving as a hermetic seal about said first portions of said component leads and said first end of said interconnecting lead.

2. The intermediate package according to claim 1 wherein said support sides of said frame member, said second portions of said component leads, and said second end of said interconnecting lead form a predetermined angle with said first portions of said component leads.

3. The intermediate package according to claim 2 wherein said predetermined angle is substantially 80°.

* * * * *